(12) United States Patent
Wang et al.

(10) Patent No.: US 11,733,203 B2
(45) Date of Patent: Aug. 22, 2023

(54) SENSING CELL AND SENSING DEVICE

(71) Applicant: National Tsing Hua University, Hsinchu (TW)

(72) Inventors: Yu-Lin Wang, Hsinchu (TW); Shin-Li Wang, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 442 days.

(21) Appl. No.: 17/156,620

(22) Filed: Jan. 24, 2021

(65) Prior Publication Data

US 2022/0128508 A1 Apr. 28, 2022

(30) Foreign Application Priority Data

Oct. 28, 2020 (TW) .................................. 109137439

(51) Int. Cl.
  *G01N 27/414* (2006.01)
  *H01L 29/423* (2006.01)
  *G01N 27/333* (2006.01)

(52) U.S. Cl.
  CPC ......... *G01N 27/414* (2013.01); *G01N 27/333* (2013.01); *H01L 29/42316* (2013.01)

(58) Field of Classification Search
  CPC ......................................... G01N 27/414–4148
  See application file for complete search history.

(56) References Cited

U.S. PATENT DOCUMENTS

| 4,874,500 A | * | 10/1989 | Madou ................. | G01N 27/403 |
| | | | | 204/408 |
| 5,183,549 A | * | 2/1993 | Joseph ............... | G01N 27/4162 |
| | | | | 204/418 |
| 2019/0250121 A1 | * | 8/2019 | Ebata ................. | G01N 27/3335 |

(Continued)

FOREIGN PATENT DOCUMENTS

| TW | 200521432 | 7/2005 |
| TW | 200944789 | 11/2009 |
| TW | M397522 | 2/2011 |

(Continued)

OTHER PUBLICATIONS

"Office Action of Taiwan Counterpart Application", dated Jun. 17, 2021, p. 1-p. 4.

(Continued)

*Primary Examiner* — Erik Kielin
(74) *Attorney, Agent, or Firm* — JCIPRNET

(57) ABSTRACT

A sensing cell includes: a first electrode coupled to a gate of a transistor, a second electrode spaced apart from the first electrode; a protective layer covering sidewalls of the first electrode and the second electrode and having a first opening and a second opening exposing a first part of the first electrode and a second part of the second electrode, respectively; a first well located on the protective layer and surrounding the first electrode and the second electrode and having a third opening exposing the first part of the first electrode, the second part of the second electrode, and the protective layer between the first opening and the second (Continued)

opening; a second well located on the protective layer surrounding the first well and having a fourth opening to limit a flow of a liquid to be tested; and an ion selective membrane located in the third opening.

16 Claims, 13 Drawing Sheets

(56) References Cited

U.S. PATENT DOCUMENTS

| | | | | |
|---|---|---|---|---|
| 2021/0262003 | A1* | 8/2021 | Knopfmacher | G01N 27/4148 |
| 2021/0262975 | A1* | 8/2021 | Wakamori | G01N 33/0031 |

FOREIGN PATENT DOCUMENTS

| | | |
|---|---|---|
| TW | 201730556 | 9/2017 |
| TW | I648864 | 1/2019 |
| WO | 2019175119 | 9/2019 |

OTHER PUBLICATIONS

Sai Sudheer Tatavarthi et al., "Fabrication of Heavy Metal Ion FET Based Sensor for Detecting Arsenite," IOPscience, 2020, pp. 1-3. Available at: https://doi.org/10.1149/MA2020-01251398mtgabs.

Sai Sudheer Tatavarthi et al., "Rapid and Highly Sensitive Extended Gate FET-Based Sensors for Arsenite Detection Using a Handheld Device," ECS Journal of Solid State Science and Technology, vol. 9, No. 11, Aug. 12, 2020, pp. 1-7.

* cited by examiner

SENSING CELL AND SENSING DEVICE

CROSS-REFERENCE TO RELATED APPLICATION

This application claims the priority benefit of Taiwan application serial no. 109137439, filed on Oct. 28, 2020. The entirety of the above-mentioned patent application is hereby incorporated by reference herein and made a part of this specification.

BACKGROUND OF THE INVENTION

Field of the Invention

The invention relates to a sensing device and a detection method, and more particularly to an ion selective membrane sensing device and an ion detection method.

Description of Related Art

Most heavy metal elements such as lead (Pb), mercury (Hg), cadmium (Cd), chromium (Cr), or metal-like arsenic (As), etc. not only have no physiological functions in the human body, but may cause toxic effects and even cause serious diseases because they are not easily metabolized and are accumulated in the human body. For example, a lead content in the human body exceeding the standard value easily causes Alzheimer's disease; and a mercury content exceeding the standard value damages the optic nerves of the brain considerably. Therefore, it is very important to detect the content of heavy metals in water to ensure the safety of drinking water.

The current equipment for detecting ion content in water is, for example, inductively-coupled plasma-atomic emission spectrometer (ICP-AES), inductively-coupled plasma-mass spectrometer (ICP-MS), or ion selective electrode (ISE). ICP-AES and ICP-MS are expensive and large-scale instruments in the laboratory. Their operation methods are complicated and require analysis by professionals. Not only may they not detect on site, but they are also not suitable for ordinary personnel. Although the ion selective electrode is easy to carry and suitable for on-site detection, its detection limit is about 500 ppb, which is not enough to confirm whether the content of heavy metal ions in the water meets standard values specified by current regulations. For example, in terms of lead, currently Taiwan requires that the lead ion content in water to be less than 50 ppb (about $2.42 \times 10^{-7}$ M), and the detection limit of the ion selective electrode is much higher than the standard value of lead ions, so it is impossible to confirm whether the lead ion content in the water exceeds the standard. In addition, the ion selective electrode needs to be combined with a reference electrode for detection, so the overall detection cost is still high.

Therefore, a sensing device having low detection limit and high sensitivity suitable for real-time detection on site is in actuality one of the subjects actively researched by those skilled in the art.

SUMMARY OF THE INVENTION

The invention provides a sensing device and an ion detection method that have the characteristics of low detection limit and high sensitivity and are suitable for real-time detection on site.

A sensing cell of an embodiment of the invention includes: a first electrode located on a substrate and coupled to a gate of a transistor; a second electrode spaced apart from the first electrode and located on the substrate; a protective layer covering sidewalls of the first electrode and the second electrode and having a first opening and a second opening respectively exposing a first top surface of a first part of the first electrode and a second top surface of a second part of the second electrode; a first well located on the protective layer and surrounding the first electrode and the second electrode and having a third opening exposing the first top surface of the first part of the first electrode, the second top surface of the second part of the second electrode, and a top surface of the protective layer between the first opening and the second opening; a second well located on the protective layer and surrounding the first well and having a fourth opening exposing the first well, the first top surface of the first part of the first electrode, the second top surface of the second part of the second electrode, and the top surface of the protective layer between the first opening and the second opening; and an ion selective membrane located in the third opening and covering the first top surface of the first part of the first electrode, the second top surface of the second part of the second electrode, and the protective layer between the first opening and the second opening.

A sensing device of an embodiment of the invention includes: a plurality of sensing cells located on a substrate, wherein each of the sensing cells includes: a first electrode coupled to a gate of a transistor; a second electrode separated from the first electrode and located on the substrate; a protective layer covering sidewalls of the first electrode and the second electrode and having a first opening and a second opening respectively exposing a first top surface of a first part of the first electrode and a second top surface of a second part of the second electrode; a first well located on the protective layer and surrounding the first electrode and the second electrode and having a third opening exposing the first top surface of the first part of the first electrode, the second top surface of the second part of the second electrode, and the protective layer between the first opening and the second opening; a second well located on the protective layer and surrounding the first well and having a fourth opening exposing the the first well, the first top surface of the first part of the first electrode, the second top surface of the second part of the second electrode, and the protective layer between the first opening and the second opening; and an ion selective membrane located in the third opening and covering the first top surface of the first part of the first electrode, the second top surface of the second part of the second electrode, and the protective layer between the first opening and the second opening.

Based on the above, the sensor device having an ion selective membrane of the invention has low detection limit and high sensitivity, and is suitable for real-time detection on site.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
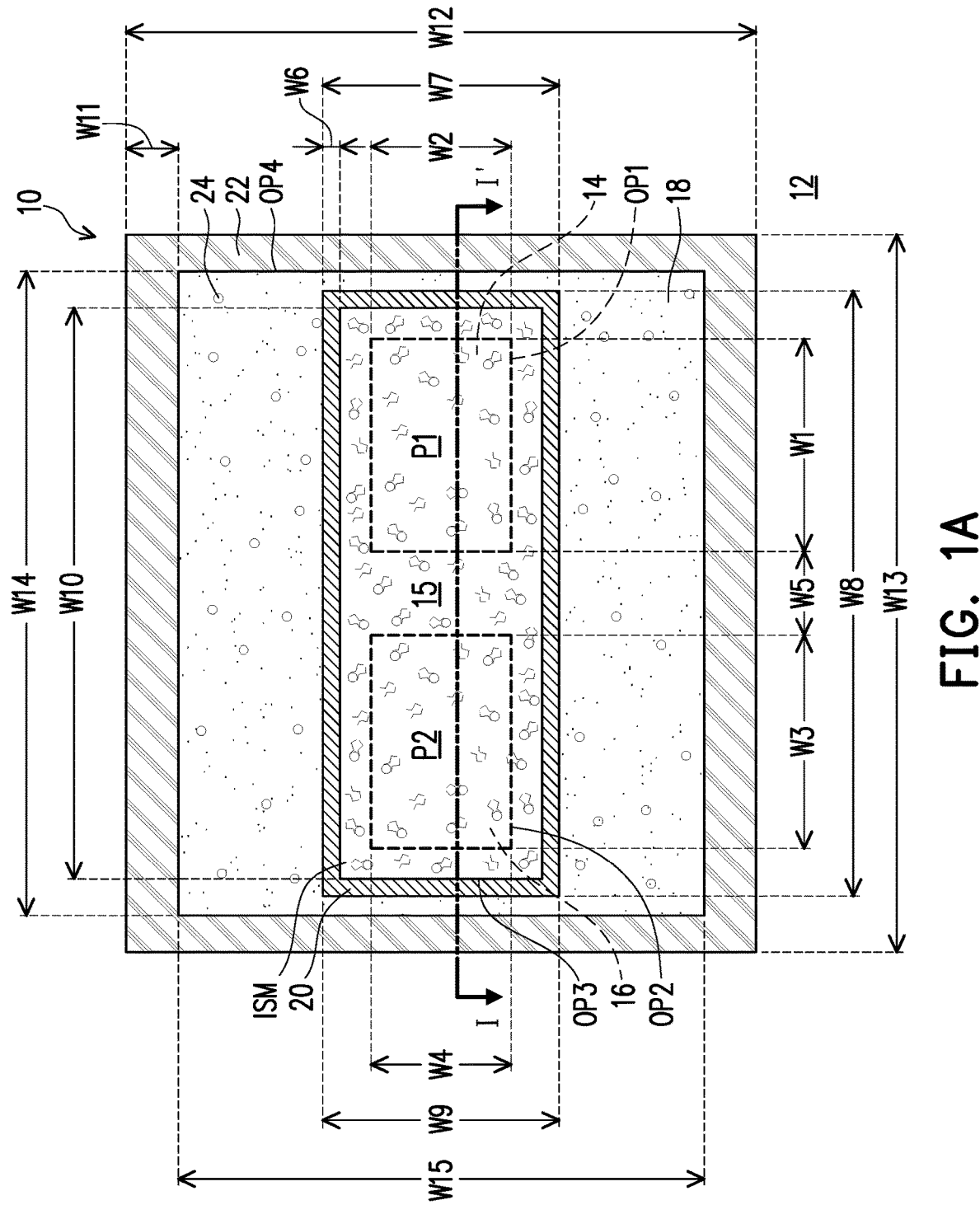
FIG. 1A is a top view of a sensing cell having an ion selective membrane according to an embodiment of the invention.
Figure 1B:
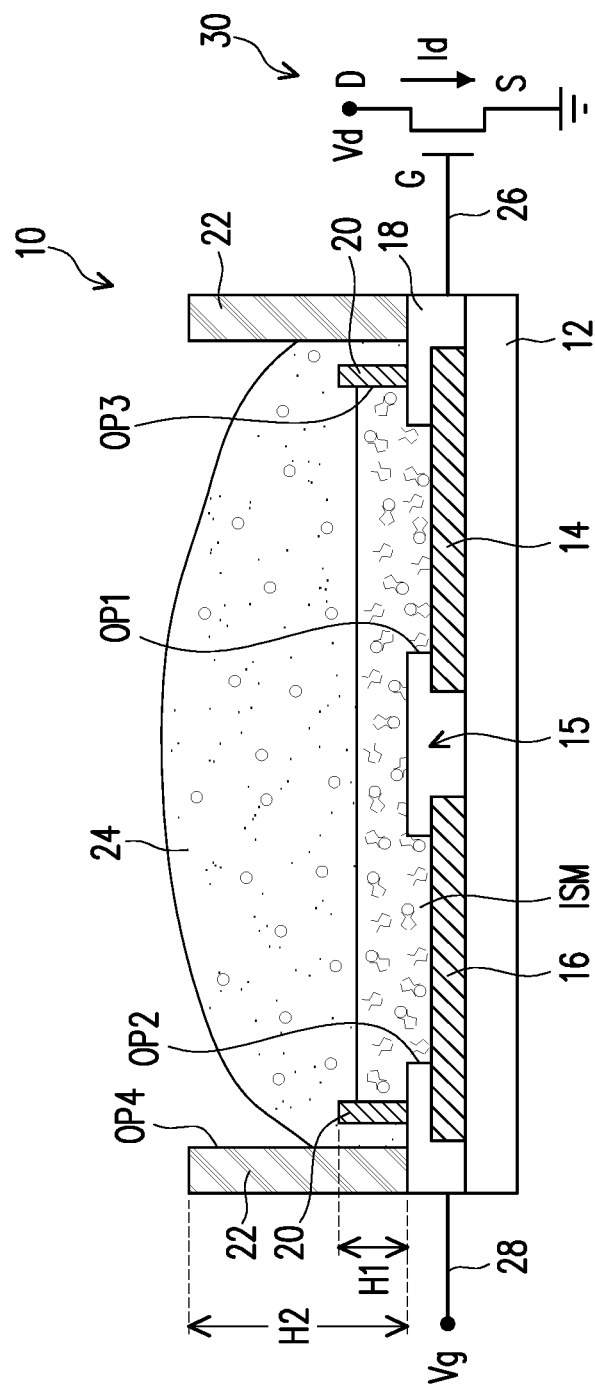
FIG. 1B is a cross-sectional view along line I-I' of FIG. 1A.

Referring to FIG. 1A and FIG. 1B, a sensing cell 10 of an embodiment of the invention has an ion selective membrane that may be applied to detect the ion content in a solution, but the invention is not limited thereto. The sensing cell 10 may detect metal ions in the solution, such as arsenic ions, lead ions, cadmium ions, chromium ions, or mercury ions. In other embodiments, the sensing cell 10 may also be used as a gas sensor or other suitable sensors.

The sensing cell 10 is disposed on a substrate 12. The sensing cell 10 includes a first electrode 14, a second electrode 16, a protective layer 18, a first well 20, an ion selective membrane ISM, and a second well 22. A liquid 24 to be tested may be added dropwise into the second well 22 to be in contact with the ion selective membrane ISM.

The substrate 12 is, for example, an insulating substrate. The material of the insulating substrate includes epoxy resin, printed circuit board, or silicon wafer. The substrate 12 may also be a composite substrate, such as a composite substrate composed of a semiconductor layer and an insulating layer. The material of the semiconductor layer is, for example, gallium nitride (GaN), aluminum indium nitride (AlInN), aluminum gallium nitride (AlGaN), or a combination thereof. The insulating layer is, for example, silicon oxide.

The first electrode 14 is located on the substrate 12 and may be electrically connected to a gate G of a transistor 30 via a conductive line 26; and the second electrode 16 is located on the substrate 12 and may be electrically connected to a conductive line 28, as shown in FIG. 1B. The second electrode 16 is spaced apart from the first electrode 14. The material of the first electrode 14 and the second electrode 16 includes metal, such as gold. The second electrode 16 may also be referred to as an extended gate. The sizes of the first electrode 14 and the second electrode 16 may be the same or different. The top view shapes of the first electrode 14 and the second electrode 16 may be square or rectangular. In some embodiments, lengths W1 and W2 of the two sides of the first electrode 14 and lengths W3 and W4 of the two sides of the second electrode 16 range from, for example, about 400 μm to about 600 μm, such as 500 μm. A width W5 of a gap 15 between the second electrode 16 and the first electrode 14 is, for example, about 50 μm to about 150 μm, such as about 100 μm.

The protective layer 18 is formed on the substrate 12, filled in the gap 15 between the first electrode 14 and the second electrode 16, and covers the sidewalls and a part of the top surfaces of the first electrode 14 and the second electrode 16. The protective layer 18 has a first opening OP1 and a second opening OP2 exposing the top surface of a first part P1 of the first electrode 14 and the top surface of a second part P2 of the second electrode 16, respectively. The areas of the first opening OP1 and the second opening OP2 may be the same or different. The first opening OP1 and the second opening OP2 are rectangular, such as a square, but the invention is not limited thereto. The shape of the first opening OP1 and the second opening OP2 may also be circular, elliptical, polygonal, or a combination thereof. The material of the protective layer 18 is, for example, photoresist, polyamide, solder resist, or photosensitive polyimide.

The first well 20 surrounds the first electrode 14 and the second electrode 16. In some embodiments, the first well 20 is located on the top surface of the protective layer 18. In some other embodiments, the first well 20 is located on the top surface of a base 12. The first well 20 has a third opening OP3 for containing the solution of the ion selective membrane ISM. The third opening OP3 exposes the top surface of the first part P1 of the first electrode 14, the top surface of the second part P2 of the second electrode 16, and the top surface of the protective layer 18 between the first opening OP1 and the second opening OP2. The first well 20 is used to limit the height of the selective solution applied in the third opening OP3 for forming the ion selective membrane ISM. The material of the first well 20 includes a high molecular polymer, such as resin, polyvinyl alcohol (PVA), or a combination thereof. A width W6 of the first well 20 ranges from, for example, 50 μm to about 150 μm, such as 100 μm. A length W7 of the short side of the first well 20 ranges from, for example, 550 μm to about 900 μm, such as 600 μm. A length W8 of the long side of the first well 20 ranges from, for example, 1000 μm to about 1650 μm, such as 1300 μm.

The ion selective membrane ISM is located in the third opening OP3 and covers the top surface of the first part P1 of the first electrode 14, the top surface of the second part P2 of the second electrode 16, and the top surface of the protective layer 18 between the first opening OP1 and the second opening OP2. The ion selective membrane ISM is connected to the top surface of the first part P1 of the first electrode 14 and the top surface of the second part P2 of the second electrode 16. A length W9 of the short side of the ion selective membrane ISM ranges from, for example, 450 μm to about 750 μm, such as 600 μm. A length W10 of the long side of the ion selective membrane ISM ranges from, for example, 850 μm to about 1350 μm such as 1100 μm.

After the target metal ion to be tested is known, the composition of the ion selective membrane ISM may be selected for manufacture according to the target metal ion to be tested. The solution used to form the ion selective membrane ISM may be added dropwise into the third opening OP3 of the first well 20 and dried for molding. For example, the target metal ion to be tested is arsenic ion, and the composition of the ion selective membrane ISM includes an ionophore of a compound that may be strongly complexed with the arsenic ion. In addition to the ionophore, the ion selective membrane ISM also includes a main base membrane, a plasticizer, and an ion exchanger. In some embodiments, the ion selective membrane ISM includes: a main base film at 20 wt % to 35 wt %; a plasticizer at 55 wt % to 70 wt %; an ionophore at 1 wt % to 5 wt %; and an ion exchanger at 0 wt % to 10 wt %. The solution used to form the ion selective membrane ISM contains various components of the ion selective membrane ISM and a solvent. The solvent is, for example, tetrahydrofuran (THF).

The main base membrane is used as the basis of the ion selective membrane ISM and used as an anchor for other components. The main base film includes a polymer. The weight-average molecular weight of the polymer is, for example, 22000 g/mol to 233000 g/mol. The polymer is, for example, polyvinyl chloride (PVC). PVC has both flexibility and mechanical strength. The polymer may also be PVA.

The plasticizer may increase the plasticity of the ion selective membrane ISM without causing excessive deterioration to mechanical properties, so as to increase the adhesion of the ion selective membrane ISM to a solid surface (such as a gold electrode). In addition, the plasticizer may reduce the ohmic resistance of the ion selective membrane ISM to increase the responsiveness thereof to ions. Furthermore, the plasticizer may make the ionophore more soluble therein, so the presence of the plasticizer may increase the ratio of the ionophore and promote the ion exchange thereof. Based on the total weight of the ion selective membrane ISM, the weight percentage of the plasticizer is, for example, about twice that of the main base membrane (such as PVC). The plasticizer may be ether, diacid, or fatty acid ester. The plasticizer is, for example, 2-nitrophenyl octyl ether, di(2-ethylhexyl) sebacate, dibutyl phthalate, or di-n-octyl phthalate.

The ionophore is a compound that may be strongly complexed with the target metal ion and is highly selective. The ionophore is directly related to factors such as ion selectivity, detection limit, and sensitivity (for example, the theoretical value of Nernst Equation). In some embodiments, the ion selective membrane ISM is a lead ion selective membrane, and the ionophore is arsenite ionophore I such as (5,10,15,20-tetrakis(4-methoxyphenyl)porphyrine cobalt(II) complex (TMOPP-Co). In other embodiments, the ion selective membrane ISM is a lead ion selective membrane, and the ionophore is a lead ionophore, such as lead ionophore II or lead ionophore IV. In other embodiments, the ion selective membrane ISM is a mercury ion selective membrane, and the ionophore is a mercury ionophore, such as mercury ionophore I. In other embodiments, the ion selective membrane ISM is a cadmium ion selective membrane, and the ionophore is a cadmium ionophore, such as cadmium ionophore I. In some other embodiments, for the chromium ion selective membrane, the ionophore is a chromium ionophore, such as quinaldine red.

The ion exchanger includes borate containing four benzene rings. The borate containing four benzene rings is, for example, sodium borate containing four benzene rings or potassium borate containing four benzene rings. The ion exchanger may be potassium tetrakis(4-chlorophenyl)borate, potassium tetrakis(3,5-bis(2trifluoromethyl)phenyl)borate, or sodium tetraphenylborate (NaTPB). After the ion exchanger dissociates sodium or potassium ions, negatively charged sites are formed. Therefore, the same negatively charged ions may be blocked from approaching, and the chance of positively charged ions (such as arsenic ions) contacting the ion selective membrane ISM may be increased. On the whole, the liquid 24 to be tested and the positive ions in the ion selective membrane ISM have undergone ion exchange. In addition, the ion exchanger may also reduce the ohmic resistance of the ion selective membrane ISM and improve ion response and selectivity.

The second well 22 surrounds the first well 20 to limit the distribution range of the liquid 24 to be tested. In some embodiments, the second well 22 is located on the top surface of the protective layer 18. In some other embodiments, the second well 22 is located on the top surface of the base 12. The second well 22 has a fourth opening OP4. Before the ion selective membrane ISM is formed, the fourth opening OP4 of the second well 22 exposes the first well 20, the top surface of the first part P1 of the first electrode 14, the top surface of the second part P2 of the second electrode 16, and a part of the protective layer 18. After the ion selective membrane ISM is formed, the fourth opening OP4 of the second well 22 exposes the ion selective membrane ISM, the first well 20, and a part of the protective layer 18. The material of the second well 22 includes a high molecular polymer, such as resin, PVA, or a combination thereof.

A width W11 of the second well 22 ranges from, for example, 50 μm to about 150 μm, such as 100 μm. A length W12 of a side of the second well 22 ranges from, for example, 2250 μm to about 2750 μm, such as 2500 μm. A length W13 of another side of the second well 220 ranges from, for example, 2250 μm to about 2750 μm, such as 2500 μm. A length W14 of a side of the fourth opening OP4 of the second well 22 is, for example, 2200 μm to about 2500 μm. A length W15 of another side of the fourth opening OP4 of the second well 22 is, for example, 2200 μm to about 2500 μm. A height H2 of the second well 22 is greater than a height H1 of the first well 20. In some embodiments, the bottom surfaces of the first well 20 and the second well 22 are at the same level, such as on the top surface of the protective layer 18, and the height H2 of the second well 22 ranges from 300 μm to 1500 μm, such as 800 μm; and the height H1 of the first well 20 is, for example, 50 μm to 300 μm, such as 150 μm.

During testing, the liquid 24 to be tested is added dropwise into the fourth opening OP4 of the second well 22 first. The second well 22 may limit the height of the liquid 24 to be tested applied in the fourth opening OP4 to prevent the liquid 24 to be tested from flowing out to another sensing cell and causing errors in the detection process. The liquid 24 to be tested may be in contact with the ion selective membrane ISM, and the liquid 24 to be tested may perform ion exchange with the positive ions in the ion selective membrane ISM.

The liquid 24 to be tested is added dropwise into the fourth opening OP4 of the second well 22. Then, detection is performed. During detection, a source S of the transistor 30 is grounded, a drain voltage is applied to a drain D, and a voltage Vg is applied to the second electrode 16 via the conductive line 28. The applied voltage Vg is, for example, −10 V to 10 V. The voltage Vg across the ion selective membrane ISM and the gate dielectric layer of the transistor 30 produces a voltage drop. If there is no target metal ion (such as $As^{3+}$ ion) in the liquid 24 to be tested, a blank (background) drain current may be detected.

If there is a target metal ion (such as $As^{3+}$ ion) in the liquid 24 to be tested and the target metal ion (such as $As^{3+}$ ion) is captured by the ion selective membrane ISM, that is, when the positive ions of the ion selective membrane ISM are exchanged with the positive ions in the liquid 24 to be tested, the conductivity of the ion selective membrane ISM is changed, thus causing the voltage drop ΔV of the ion selective membrane ISM to be changed and resulting in a change in drain current. The concentration of the target metal ion in the solution 24 to be tested may be determined by the change of the drain current. The more of the target metal ion is in the liquid 24 to be tested, the more of the target metal ion may be captured by the ion selective membrane ISM, and the greater the change in voltage drop ΔV of the ion selective membrane ISM. As a result, the amount of change of the detected drain current Id is greater.

The voltage drop caused by the target metal ion (such as $As^{3+}$ ion) in the ion selective membrane ISM may be changed by adjusting the voltage Vg applied to the second electrode 16. In addition, the transistor 30 may amplify a signal (voltage drop) through transconductance (gm). The sensing device and detection method of the invention may have higher sensitivity than the ideal Nernst slope.

In more detail, the voltage drop of the ion selective membrane ISM of the sensing device of the present application follows Ohm's law, as shown in the following formula:

$$V = I \times Z$$

In particular, V is gate voltage drop in the ion selective membrane ISM, I is current, and Z is total impedance of the ion selective membrane ISM. Since the principle of the sensing device of the present application is different from the traditional electric potential detection method derived from thermodynamics (free energy), the sensing device of the present application does not need to follow the Nernst equation. Therefore, the sensitivity of the sensing device of the invention is not limited to the sensitivity of the Nernst equation.

Figure 2B:
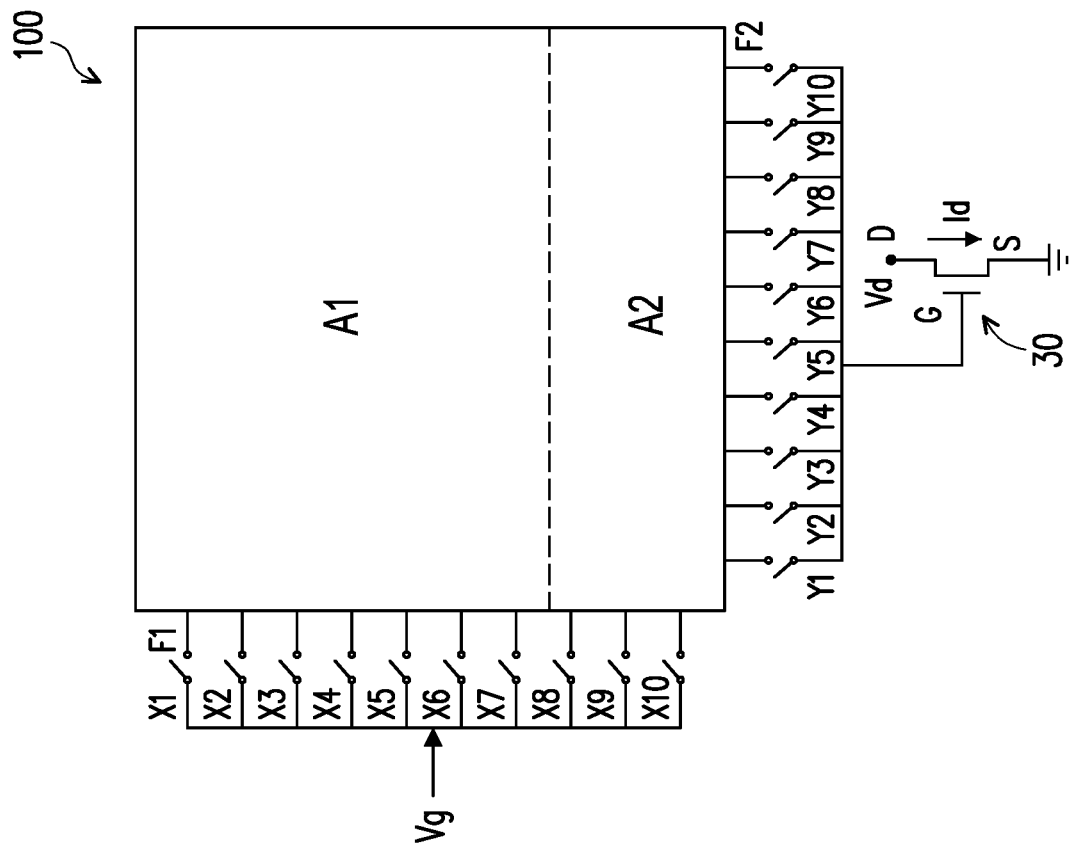
FIG. 2A and FIG. 2B are respectively diagrams of a sensing device having an ion selective membrane according to an embodiment of the invention.
Figure 2A:
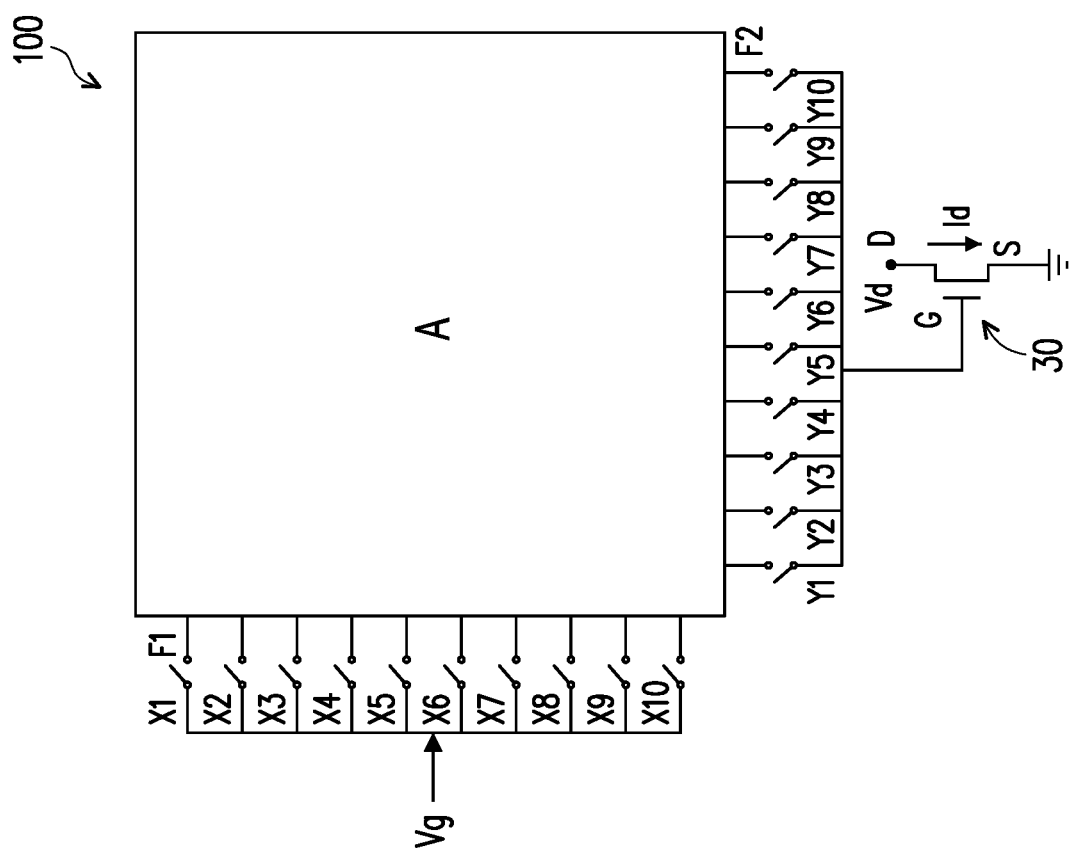
Figure 3:
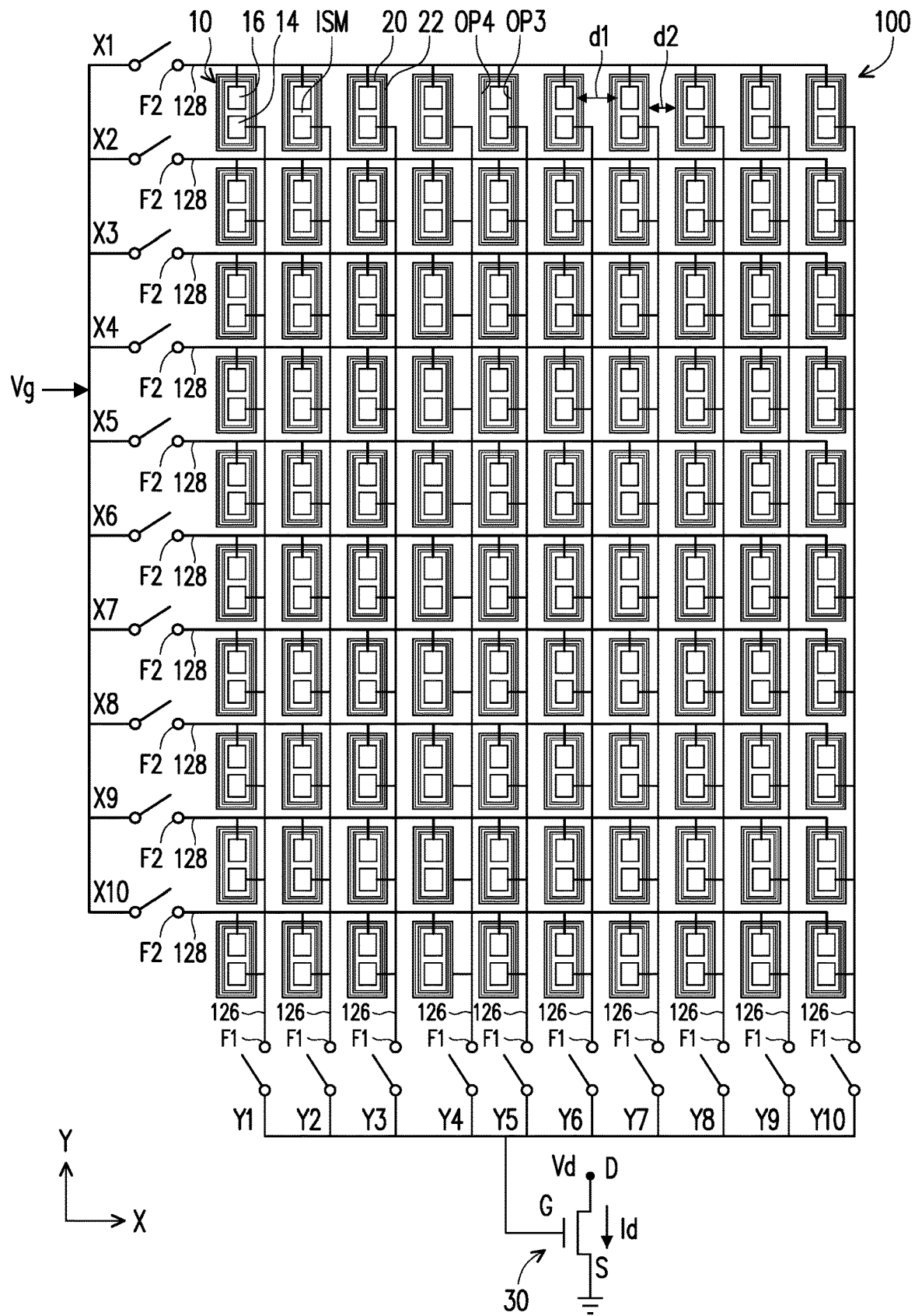
FIG. 3 is a diagram of a sensing device having an ion selective membrane according to an embodiment of the invention.

Please refer to FIG. 2A, the sensing cell 10 may be manufactured as a sensing device 100. The sensing device 100 has a plurality of sensing cells 10 disposed on the substrate 12. The plurality of sensing cells 10 may be arranged in one array A, for example, a 10×10 array, as shown in FIG. 3, but is not limited thereto. The plurality of sensing cells 10 may also be arranged in a plurality of arrays, such as arrays A1 and A2, as shown in FIG. 2B. The size of a plurality of sensing cells 10 in the same array (for example, the array A1 or the array A2) may be the same, and the size of a plurality of sensing cells 10 in different arrays may be the same or different.

Referring to FIG. 3, each of the sensing cells 10 includes the first electrode 14, the second electrode 16, the protective layer 18, the first well 20, the ion selective membrane ISM, and the second well 22, as shown in FIG. 1A and FIG. 1B. For clear description, a plurality of sensing cells 10 having a single array of 10×10 are taken as an example to illustrate the sensing device 100 of the invention.

Referring to FIG. 3, the protective layer 18 of each of the sensing cells 10 is formed on the substrate 12, filled in the gap 15 between the first electrode 14 and the second electrode 16, and covers the sidewalls and part of the top surfaces of the first electrode 14 and the second electrode 16. In addition, the protective layers 18 of a plurality or all of the sensing cells 10 may be connected to each other as a continuous layer or separated from each other into a plurality of blocks.

The first well 20 used to limit the position of the ion selective membrane ISM may separate two adjacent ion selective membranes ISM from each other. The range of a distance dl between two adjacent ion selective membranes ISM is, for example, 2500 μm to 3500 μm, such as 3000 μm.

Referring to FIG. 2A and FIG. 3, in some embodiments, the area of the third opening OP3 of the first well 20 of a plurality of sensing cells 10 in the same array A is the same, so that the ion selective membrane ISM formed therein has the same area.

Please refer to FIG. 2A, FIG. 2B, and FIG. 3. The size and composition of the ion selective membrane ISM of a plurality of sensing cells 10 in the same array A may be the same or different. The size and composition of the ion selective membrane ISM of a plurality of sensing cells 10 in different arrays A1 and A2 may be the same or different. For example, in some embodiments, the size of the ion selective membrane ISM of a plurality of sensing cells 10 in different arrays A1 and A2 is the same, but the composition of the ion selective membrane ISM is different to detect different target metal ions. In some other embodiments, the size of the ion selective membrane ISM of a plurality of sensing cells 10 in different arrays A1 and A2 is different, but the composition of the ion selective membrane ISM is the same to detect target metal ions having different concentrations. As a result, the sensing device 100 may perform a plurality of detections on analytes of the same or different types at the same time, which not only may increase the reliability of the detection result, but may also reduce the time needed for the detection.

Referring to FIG. 2A and FIG. 3, in some embodiments, the first electrodes 14 in the same column are electrically connected to each other by a conductive line 126; and the second electrodes 16 in the same row are electrically connected to each other by a conductive line 128. In the sensing device 100 having an array A composed of 10×10 sensing cells 10, there are 10 conductive lines 126 respectively connected to 10 first electrodes 14 in the same column; and there are 10 conductive lines 128 respectively connected to 10 second electrodes 16 in the same row. Gold fingers F1 of the 10 conductive lines 126 and gold fingers F2 of the 10 conductive lines 128 may be arranged on different sides. For example, the gold fingers F1 are arranged in the X direction; and the gold fingers F2 are arranged in the Y direction, as shown in FIG. 3.

Figure 4A:
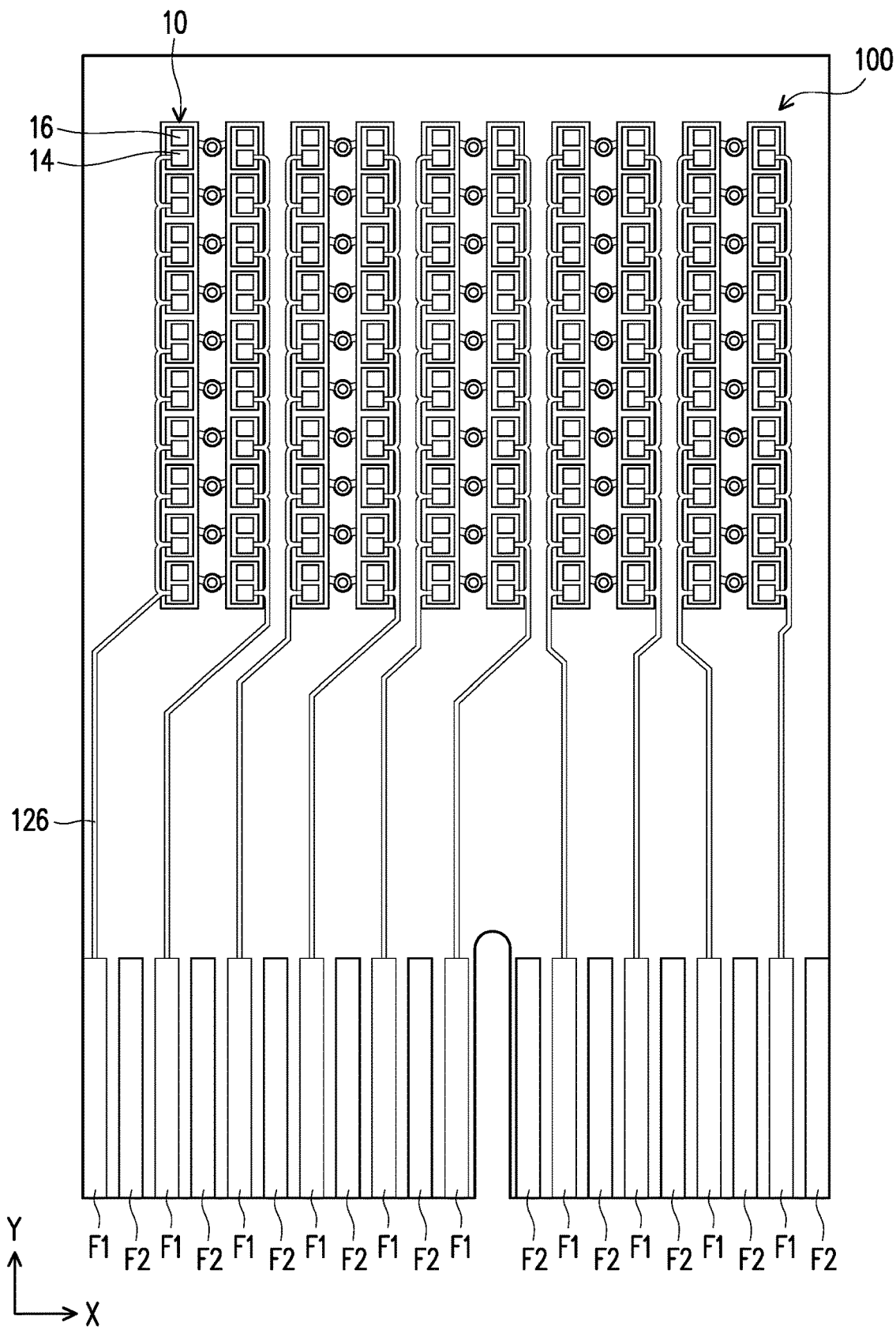
FIG. 4A is a diagram of a sensing device having an ion selective membrane according to another embodiment of the invention.
Figure 4B:
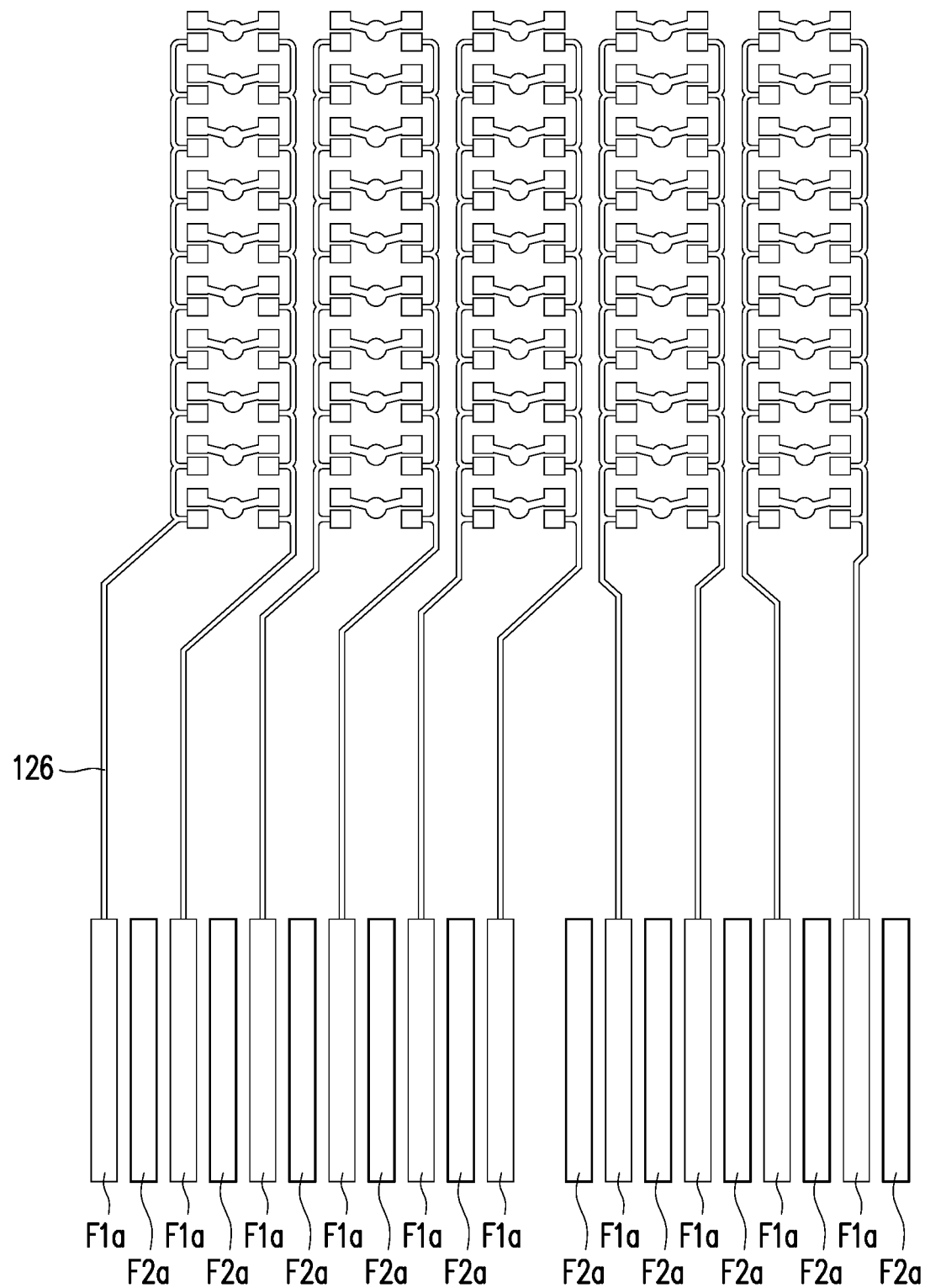
FIG. 4B and FIG. 4C are diagrams of conductive lines and gold fingers on the front side and the back side of FIG. 4A, respectively.
Figure 4C:
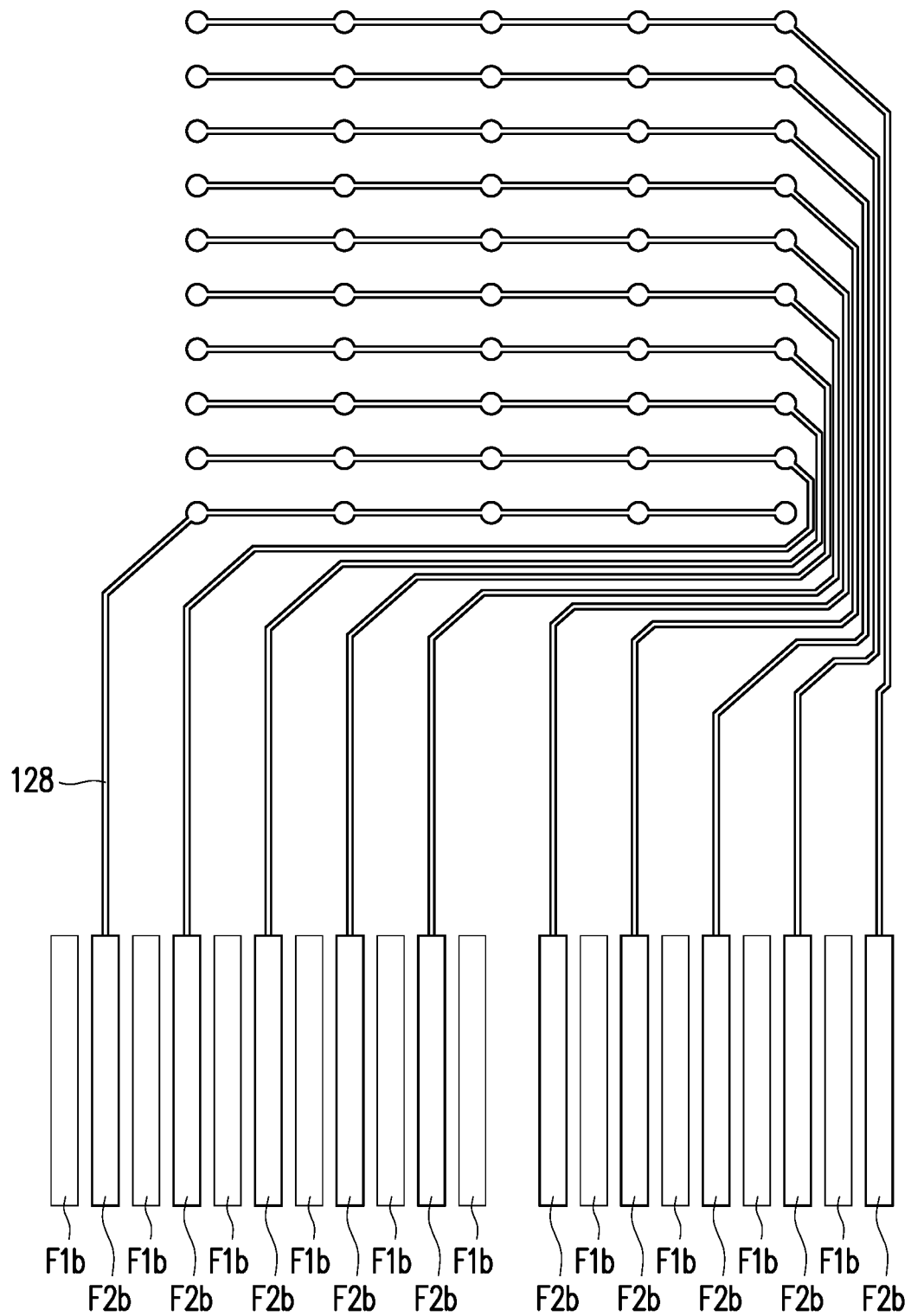

Referring to FIG. 2A and FIG. 4A to FIG. 4C, in some other embodiments, the gold fingers F1 of the 10 conductive lines 126 and the gold fingers F2 of the 10 conductive lines 128 may be arranged on the same side. For example, the gold fingers F1 of the 10 conductive lines 126 are disposed at odd-numbered positions in the X direction; and the gold fingers F2 of the 10 conductive lines 128 are disposed at odd-numbered positions in the X direction, as shown in FIG. 4A. In some embodiments, the conductive lines 126, upper parts F1a of the gold fingers F1, and upper parts F2a of the gold fingers F2 may be formed on the front sides of the first electrodes 14 and the second electrodes 16 (as shown in FIG. 4B); and the conductive lines 128, the lower parts F1b of the gold fingers F1, and the lower parts F2b of the gold fingers F2 may be formed on the back sides of the first electrodes 14 and the second electrodes 16 (as shown in FIG. 4B). The conductive lines 126 are connected to the first electrodes 14 in the same column from the front side; and the conductive lines 128 are connected to the second electrodes 16 in the same row from the back side. The upper parts F1a and the lower parts F1b of the gold fingers F1 are connected and combined to form the gold fingers F1. The upper parts F2a and the lower parts F2b of the gold fingers F2 are connected and combined to form the gold fingers F2.

Referring to FIG. 3 and FIG. 4A, 10 gold fingers F1 of 10 conductive lines 126 may be connected to 10 switch circuits Y1, Y2 . . . Y9, and Y10. The switch circuits Y1, Y2 . . . Y10 may be connected to each other and coupled to the gate G of one transistor 30. 10 gold fingers F2 of the 10 conductive lines 128 may be connected to 10 switch circuits X1, X2 . . . X9, and X10. The switch circuits X1, X2 . . . X9, and X10 may be connected to one voltage source Vg. In addition, since a plurality of first electrodes 14 share the same transistor 30, and only the ion selective membrane ISM needs to be replaced after use to perform the next detection, the cost needed for the detection may be reduced. By selectively controlling the ion selective membrane ISM to be used, the sensing device 100 may be suitable for various detection methods, such as detecting the same analyte at different times to observe the amount of change in concentration thereof with time.

Before the detection, the solution used as the ion selective membrane ISM may be added dropwise into the third opening OP3 of the first well 20. After the solution of the ion selective membrane ISM is dried to form the ion selective membrane ISM, the liquid 24 to be tested may be added dropwise above the ion selective membrane ISM. The flow range of the liquid 24 to be tested is limited by the fourth opening OP4 of the second well 22.

The second well 22 used to limit the flow range of the liquid 24 to be tested may separate two adjacent liquids 24 to be tested from each other. The range of a distance d2 between two adjacent second wells 22 is, for example, 0 μm to 1500 μm such as 1200 μm.

In some embodiments, the area and the height of the fourth opening OP4 of the second well 22 of a plurality of sensing cells 10 in the same array A (as shown in FIG. 2A) are the same, so that the liquids 24 to be tested formed therein have the same volume. In some other embodiments, the area and the height of the fourth opening OP4 of the second well 22 of a plurality of sensing cells 10 in different arrays A1 and A2 (as shown in FIG. 2B) may be the same or different, so that the liquids 24 to be tested formed therein have the same or different volumes.

During detection, the source S of the transistor 30 is grounded, a drain voltage Vd is applied to the drain D, and the switch circuits (for example, switch circuits X1 and Y9) corresponding to a first predetermined detection position (for example, (X1, Y9)) are turned on. The voltage source Vg is turned on via the switch circuit X1 and is applied to the second electrodes 16 via the conductive lines 128. Ion exchange occurs between the positive ions in the ion selective membrane ISM and the positive ions in the liquid 24 to be tested to generate a voltage drop ΔV, so that the voltage applied to the first electrodes 14 is dropped from Vg to a voltage Vg' (Vg'=Vg−ΔV). The voltage Vg' applied to the first electrodes 14 affects the detected current value Id. The content of the target metal in the liquid 24 to be tested may be obtained by the value of the current Id and related calculations.

After the detection of the first predetermined position (for example, position (X1,Y9)) is complete, the detection of a second predetermined position (for example, position (X1, Y10)) may be performed. Accordingly, the detection of all predetermined positions may be completed in a very short time.

In an embodiment of the invention, the liquid 24 to be tested at each position is confined within the fourth opening OP4 of the second well 22. The liquid 24 to be tested does not spread to the surroundings and is not connected to the liquid 24 to be tested of an adjacent sensing cell 10, and therefore mutual interference may be avoided.

Figure 5A:
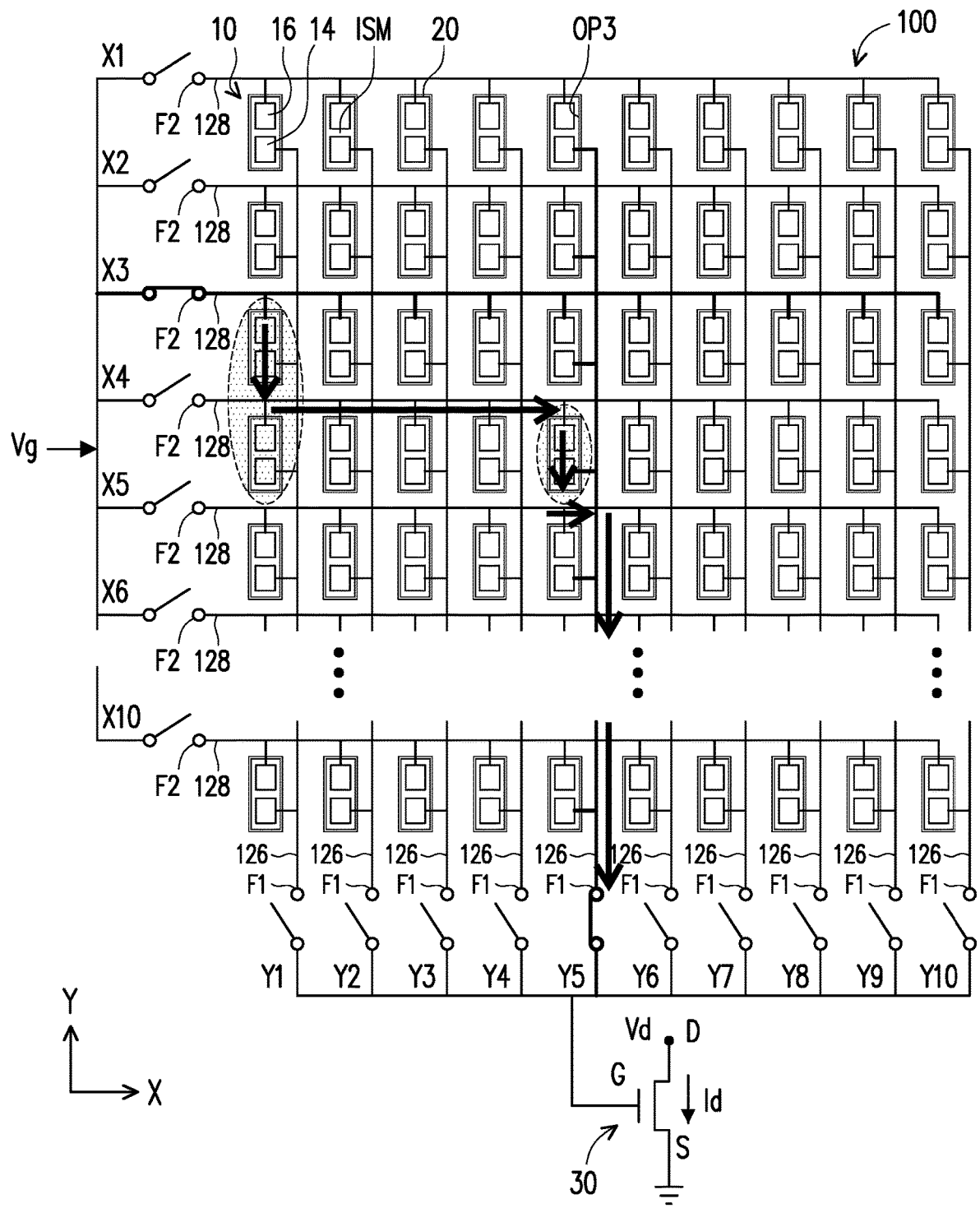
FIG. 5A is a diagram of detection error of a sensing device caused by connected liquids to be tested in the prior art.

Referring to FIG. 5A, for example, the liquid 24 to be tested is added dropwise on the positions (X3,Y1), (X4,Y1) and (X4,Y5), but not on the position (X3,Y5). The flow range of the liquids 24 to be tested at the position (X3,Y1) and the position (X4,Y1) is not limited by the second well 22 and the liquids 24 to be tested at the position (X3,Y1) and the position (X4,Y1) are connected to each other. At the detection position (X3,Y5), after the switches X3 and Y5 are turned on and the voltage Vg is applied, a current should not be detected. However, since the switch X3 is turned on, the voltage Vg is transmitted to the second electrode 16 at position (X3,Y1), and since the liquids 24 to be tested at position (X3,Y1) and position (X4,Y1) are connected to each other, the voltage drop is transmitted to the second electrode 16 at position (X4,Y1). Since the second electrode 16 at position (X4,Y1) is connected to the conductive line 128 in the fourth row, the voltage drop is transmitted to position (X4,Y5) via the conductive line 128 in the fourth row, and then transmitted to the first electrode 14 at position (X4,Y5) and the conductive line 126 in the fifth column via the action of the liquid 24 to be tested at position (X4,Y5) and the ion selective membrane ISM. Therefore, when position (X3,Y5) where there is no liquid 24 to be tested is detected, the current value Id may be obtained.

Figure 5B:
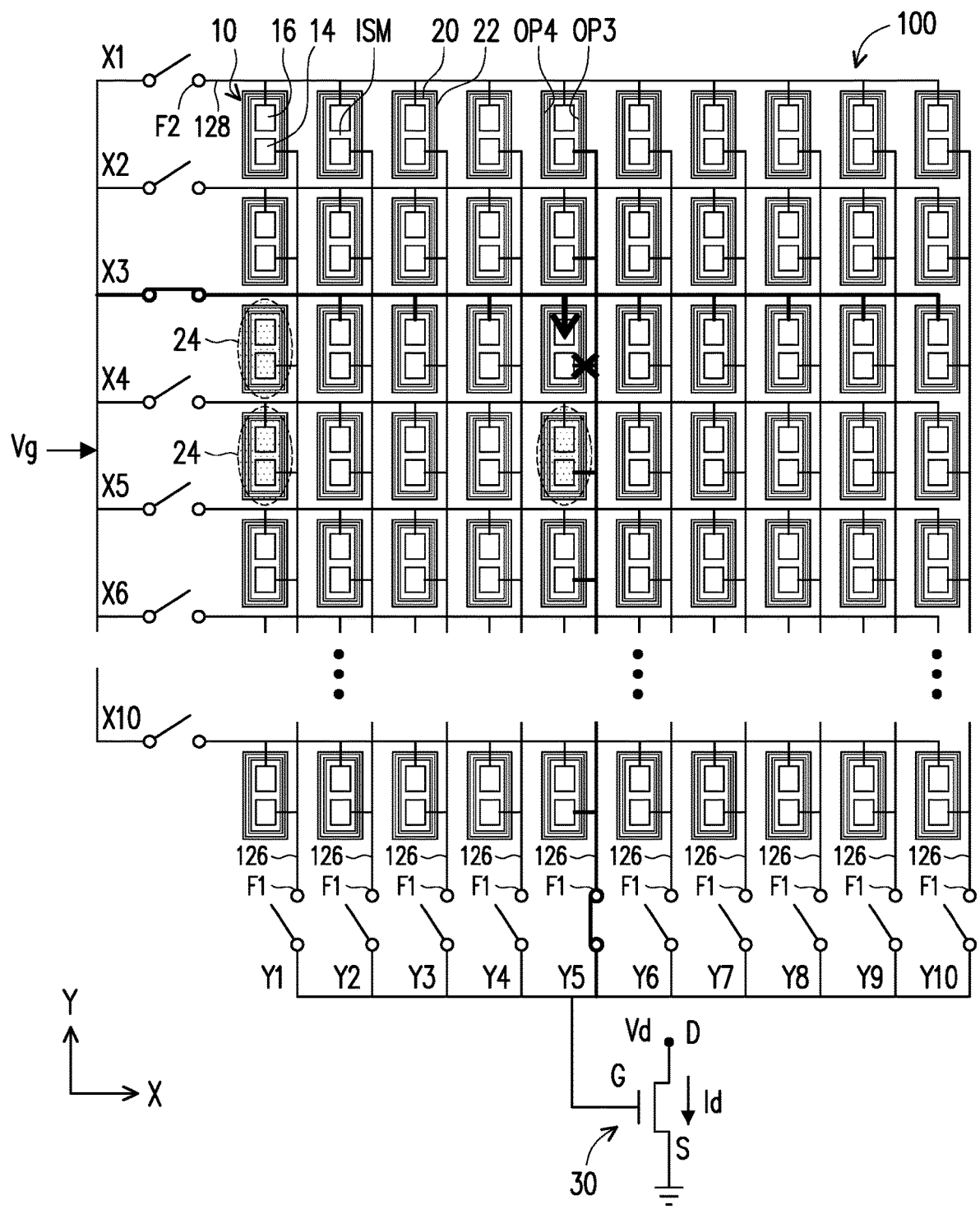
FIG. 5B is a diagram of a sensing device having an ion selective membrane of the invention detecting a liquid to be tested.

Referring to FIG. 5B, in contrast, in an embodiment of the invention, the liquid 24 to be tested is added dropwise at positions (X3,Y1), (X4,Y1) and (X4,Y5), but not at position (X3,Y5). The liquid 24 to be tested only indicates the position thereof. In actuality, at detection position (X3,Y5), the flow range of the liquids 24 to be tested at position (X3,Y1) and position (X4,Y1) is restricted by the second well 22 and the liquids 24 to be tested at position (X3,Y1) and position (X4,Y1) are separated from each other. At detection position (X3,Y5), after the switches X3 and Y5 are turned on and the voltage Vg is applied to the conductive line 128 in the third row, the current may not be detected. This is because even if the switch X3 is turned on, since the liquids 24 to be tested of position (X3,Y1) and position (X4,Y1) are separated from each other, the voltage drop generated by position (X3,Y1) may not be transmitted to position (X4,Y1), nor may it be transmitted to position (X4,Y5) via the conductive line 128 in the fourth row. Therefore, even if the liquid 24 to be tested is at position (X4,Y5), the current value Id is not obtained when position (X3,Y5) without the liquid 24 to be tested is detected.

Based on the above embodiments, it may be seen that in the sensing device and the ion detection method provided in the above embodiments, due to the arrangement of the first well 20 and the second well 22, the sensing device has the characteristics of low detection limit and high sensitivity. In addition, since the ion selective membrane ISM is disposed between the first electrode 14 and the liquid 24 to be tested and between the second electrode 16 and the liquid 24 to be tested, the sensing cell 10 has high selectivity for the liquid 24 to be tested.

In actual application, the sensing device 100 may be made into a portable sensing chip. The transistor 30 may be made into a handheld device. Before detection, the sensing chip containing the sensing device 100 may be inserted into a handheld device having the transistor 30, and then the handheld device having the transistor 30 is connected to a computer. During detection, the resulting current value may be immediately transmitted to the computer. Therefore, the operation thereof is easy, analysis does not need to be performed by professionals, and not only may detection be performed on-site, but the sensing device 100 is also suitable for use by general personnel.

In the following, the ion detection method and properties thereof provided by the invention are described in detail via experimental examples, but the following experimental examples are not intended to limit the invention. It must be noted that in the following experimental examples, the detection of the arsenic ion ($As^{3+}$) content in the liquid to be tested is taken as an example for description, but the invention is not limited thereto. The gain in the experimental examples below represents the difference between a balance current value and an initial current value (i.e., background current) (i.e., balance current value-initial current value=gain). The initial current value may represent the current value obtained by applying an initial voltage to the second electrodes 16. In the present embodiment, the initial voltage may be less than the gate voltage, but the invention is not limited thereto. The balance current value may represent the current value obtained by applying the gate voltage Vg to the second electrodes 16 for a certain period of time.

In the following examples 1 to 5, ion concentration is detected using the sensing device 100 having an ion selective membrane as exemplary embodiments. The ion selective membrane ISM used contains PVC at 33 wt %, TMOPP-Co at 1 wt %, potassium tetrakis (4-chlorophenyl) borate at 0.35 wt %, and 2-nitrophenyl octyl ether at 65.65 wt %.

EXPERIMENTAL EXAMPLES

Comparative Example 1

Figure 6B:
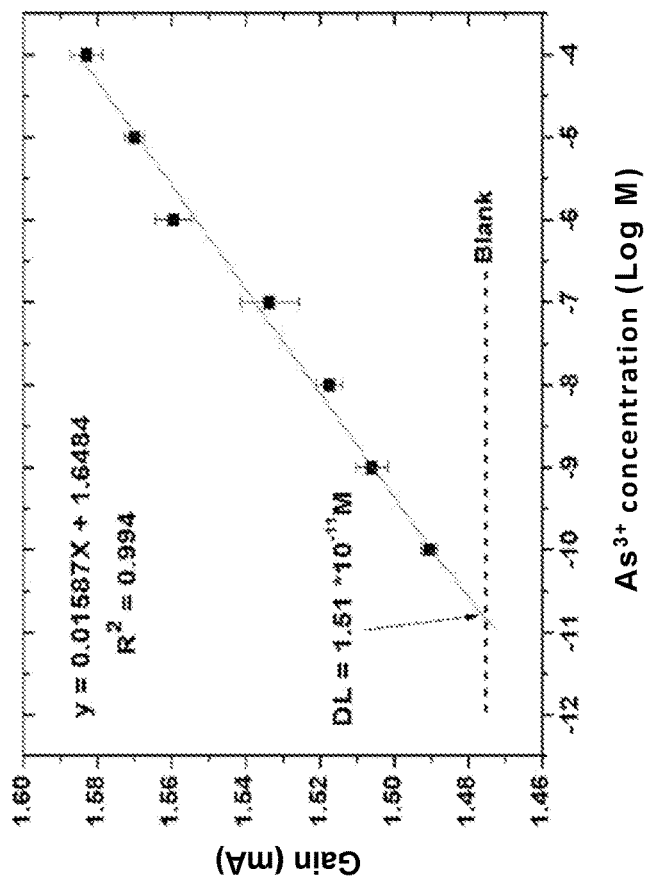
FIG. 6B is a calibration curve of arsenic ion concentration obtained by detecting arsenic ions by a sensing device having an arsenic ion selective membrane versus current gain (μA).
Figure 6A:
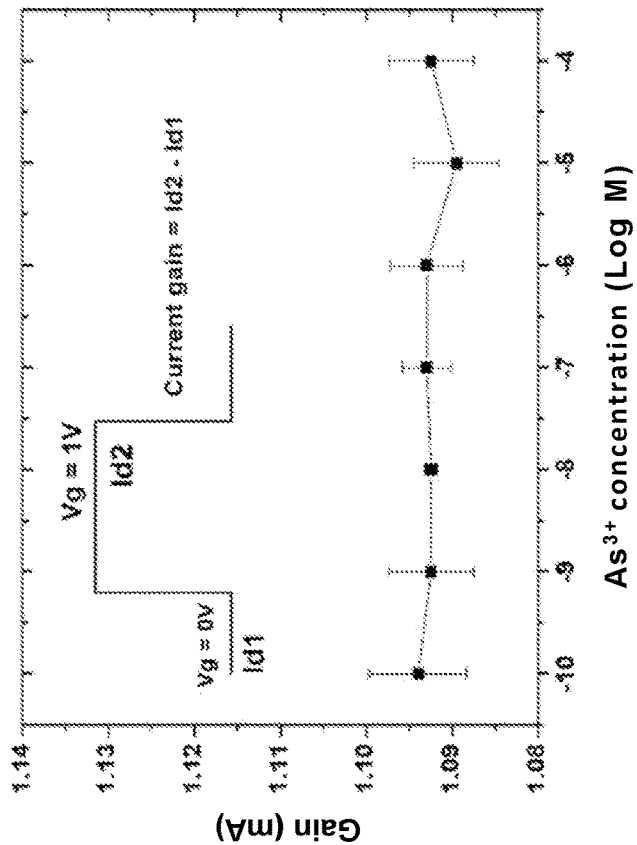
FIG. 6A is a graph showing the relationship between arsenic ion concentration (log M) and current gain (μA) obtained by detecting arsenic ions by a sensing device without an arsenic ion selective membrane.

Sodium arsenite solutions having different concentrations were detected using a sensing device without an ion selective membrane, and the results thereof are shown in FIG. 6A.

The results of FIG. 6A show that with the concentration of trivalent arsenic ion ($As^{3+}$), the gain measured by the sensing device was not changed significantly. In other words, when the sensing device did not have an ion selective membrane, the concentration change of ions in the detection solution may not be detected.

Example 1

Sodium arsenite solutions having different concentrations were detected using the sensing device 100 having an ion selective membrane of the invention, and the results thereof are shown in FIG. 6B.

The results of FIG. 6B show that as the concentration of trivalent arsenic ion ($As^{3+}$) was increased, the gain measured by the sensing device was increased significantly. In other words, when the sensing device had an ion selective membrane, the concentration change of trivalent arsenic ion ($As^{3+}$) in the detection solution may be detected. FIG. 6B may be regarded as the calibration curve of arsenic ion concentration versus current gain ($\mu A$) of an arsenic ion sensor.

Example 2

A 0.02-magnitude phosphate buffered saline solution (0.02×PBS buffer) as the liquid to be tested was added dropwise on an ion selective membrane, and different gate voltages Vg were applied to the second electrodes 16 of the sensing device 100 to detect the current value without the interference of sodium arsenite ions. The results thereof are shown in FIG. 6C.

Figure 6D:
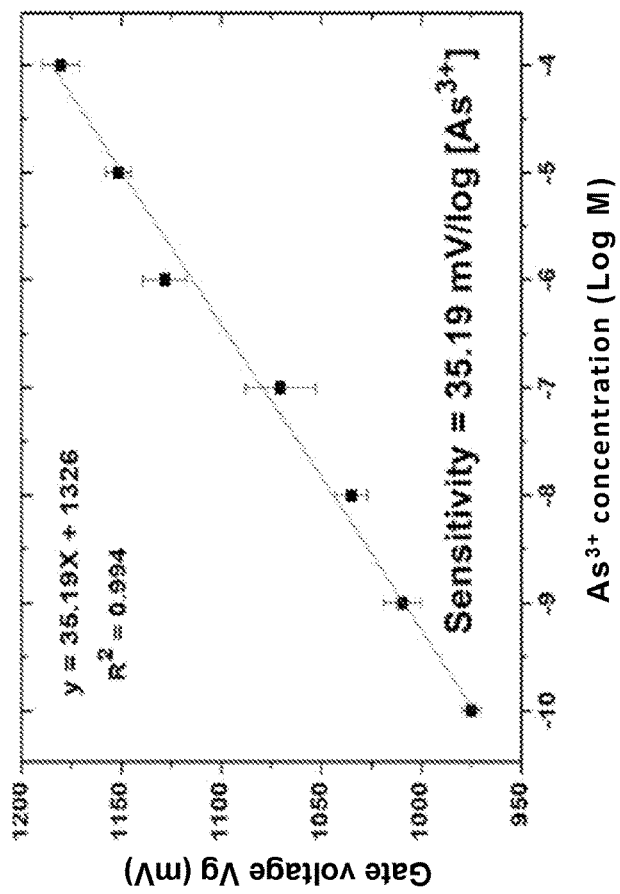
FIG. 6D is a graph showing the relationship between arsenic ion concentration and gate voltage Vg.
Figure 6C:
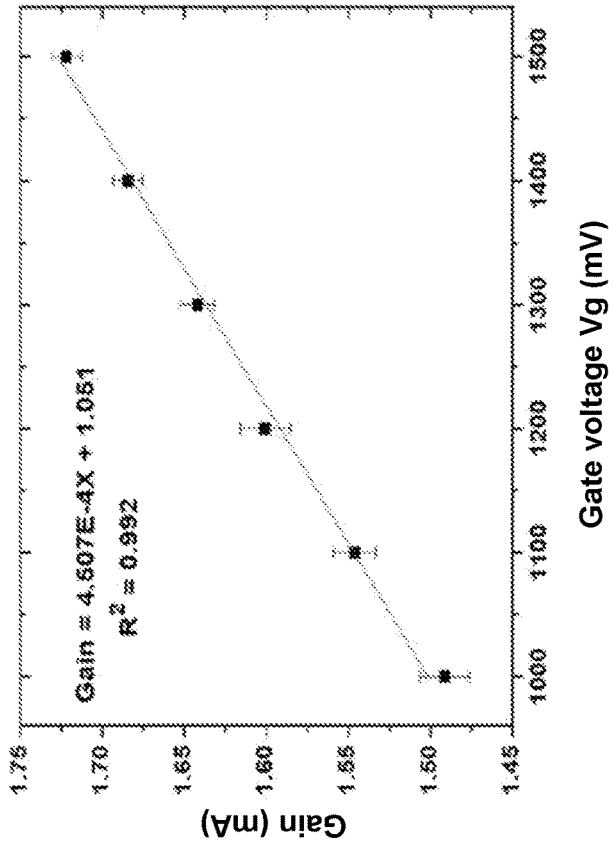
FIG. 6C is a graph showing the relationship between various gate voltages Vg and current gain (μA) obtained by applying various gate voltages Vg to a sensing device having an arsenic ion selective membrane.

The results of FIG. 6C show current values corresponding to different gate voltages Vg.

Linear regression of FIG. 6C may produce a linear regression curve, thereby obtaining a binary linear equation of current value to gate voltage value. By substituting the current value corresponding to each concentration in FIG. 6B into the binary linear equation obtained in FIG. 6C, the voltage value corresponding to each concentration may be obtained, as shown in FIG. 6D. A linear regression curve was made for concentration against voltage value in FIG. 6D, and the resulting slope was sensitivity.

The results of FIG. 6D show that the sensitivity detected by the sensing device of the invention may reach 35.19 mV/decade [$As^{3+}$].

Example 3

Selective testing was performed using the sensing device 100 having an ion selective membrane of the invention. Sodium arsenite was dissolved in a phosphate buffer solution (0.02×PBS, with a concentration range of $10^{-10}$ M to $10^{-4}$ M) to prepare liquids to be tested containing various concentrations of the $As^{3+}$ ion. In addition, liquids to be tested containing various concentrations of interfering ions, such as lead ions, cadmium ions, and pentavalent arsenic ions ($As^{5+}$) were respectively prepared, and the results thereof are shown in FIG. 7A and FIG. 7C.

Figure 7B:
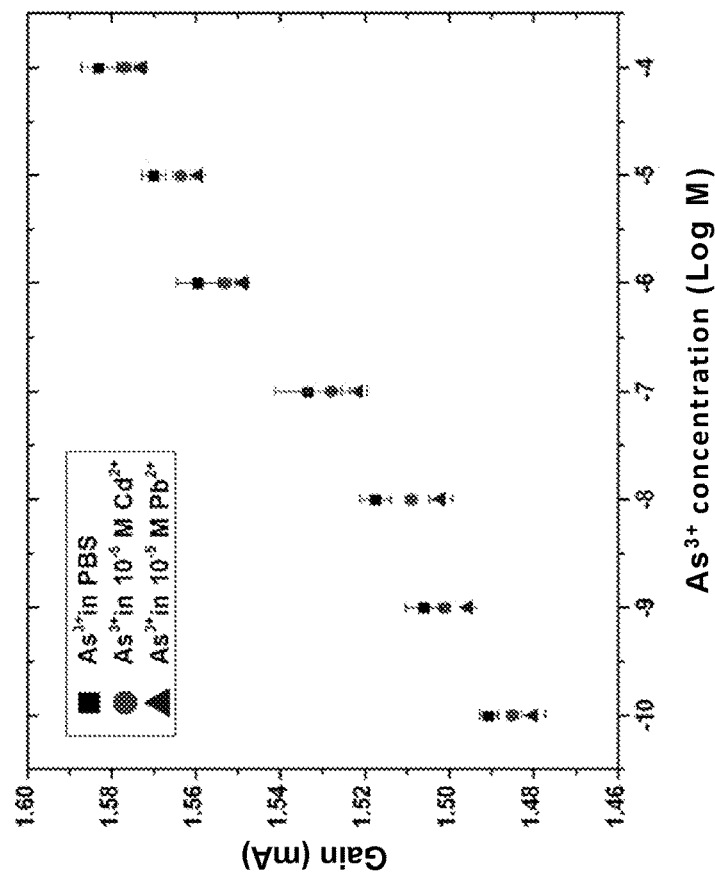
FIG. 7B is the flow gain (μA) of arsenic ions ($As^{3+}$) having various concentrations in a phosphate standard buffer solution (0.02×PBS), a cadmium ion solution, and a lead ion solution detected by a sensing device having an arsenic ion selective membrane, respectively.
Figure 7A:
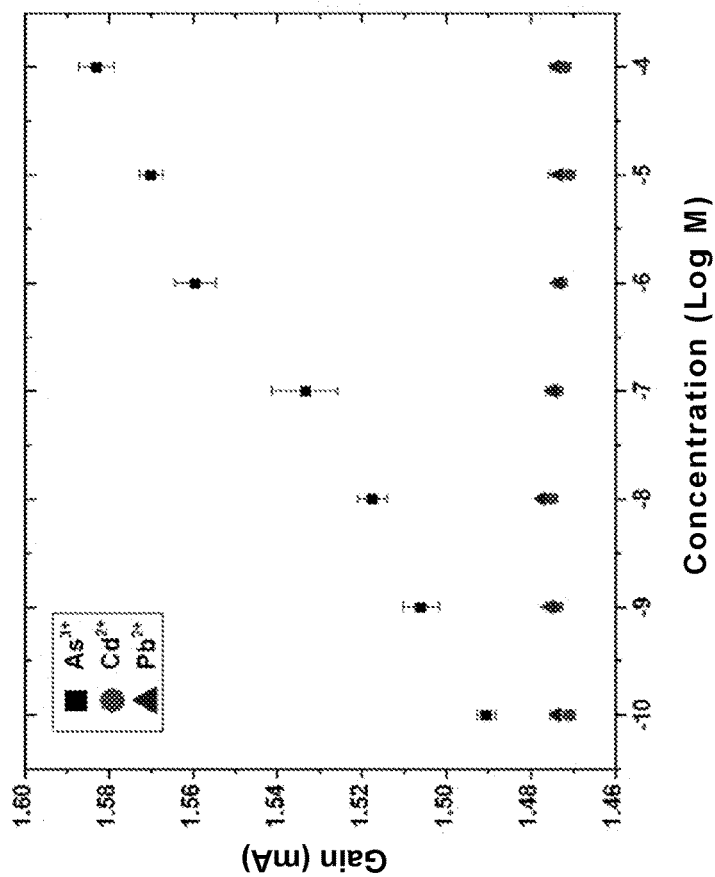
FIG. 7A is a graph showing the relationship between concentration (log M) and current gain (μA) of an arsenic ion ($As^{3+}$) solution, a lead ion solution, and a cadmium ion solution detected by a sensor device having an arsenic ion selective membrane, respectively.
Figure 7D:
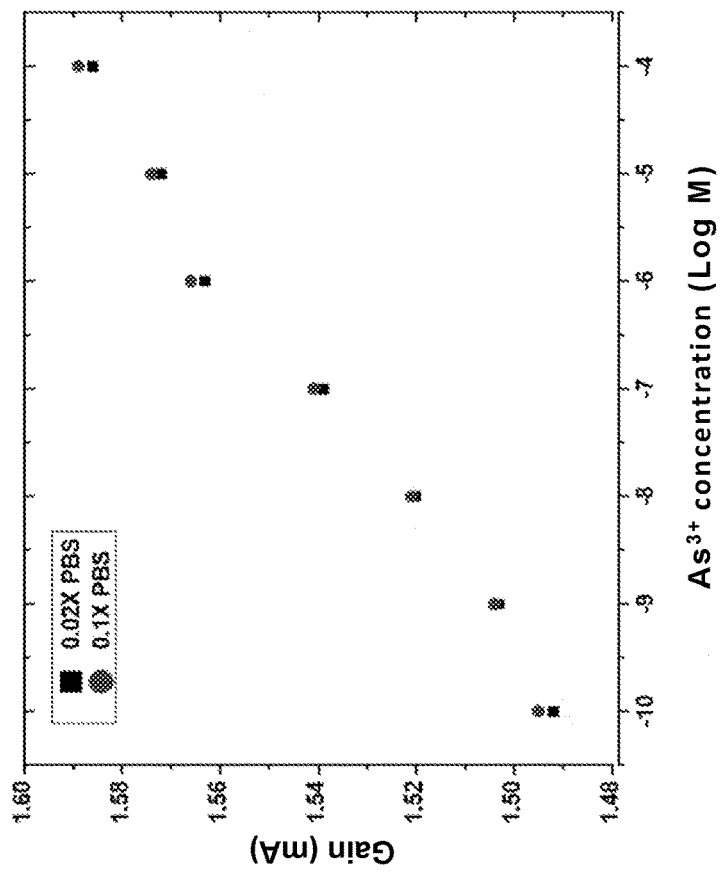
FIG. 7D is the flow gain (μA) of arsenic ions ($As^{3+}$) having various concentrations in phosphate buffer solutions of different conductivities detected by a sensing device having an arsenic ion selective membrane, respectively.
Figure 7C:
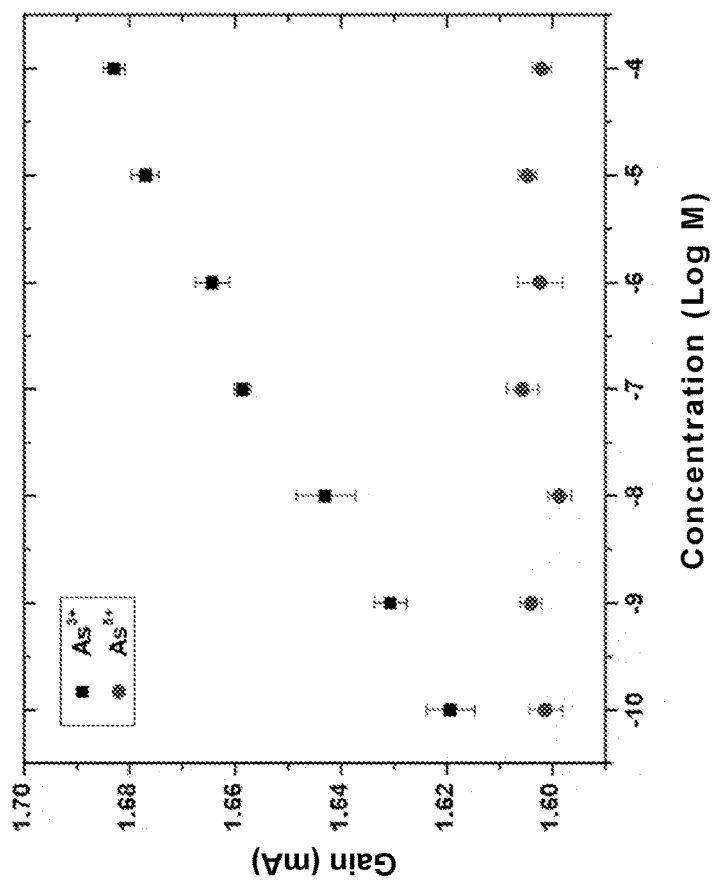
FIG. 7C is a graph of the relationship between concentration (log M) and current gain (μA) of an arsenic ion ($As^{3+}$) solution and a pentavalent arsenic ion ($As^{5+}$) solution detected by a sensor device having an arsenic ion selective membrane, respectively.

The results of FIG. 7A and FIG. 7C show that as the concentration of the trivalent arsenic ion ($As^{3+}$) was increased, the current value measured by the arsenic ion sensor was also increased. As the concentration of interfering ions such as pentavalent arsenic ions ($As^{5+}$), lead ions, and cadmium ions was increased, the current value measured by the arsenic ion sensor was not changed. Therefore, the arsenic ion sensor of the invention had good selectivity to pentavalent arsenic ions, lead ions, and cadmium ions.

Example 4

Sodium arsenite was dissolved in three different solutions respectively to prepare liquids to be tested having various concentrations. The three different solutions were respectively at pH 7 and were a phosphate standard buffer solution (0.02×PBS), a cadmium ion solution containing $10^{-5}$ M $Cd(NO_3)_2$, and a lead ion solution containing $10^{-5}$ M $Pb(NO_3)_2$. Then, detection was performed using the sensing device 100 having an arsenic ion selective membrane of the invention, and the results are shown in FIG. 7B.

The results from FIG. 7B show that the arsenic ion sensor may detect the current values of all three solutions. Although the current values of the three solutions were slightly different, they were all increased with the increase of trivalent arsenic ion concentration. This means that the high concentration of interfering ions such as lead ions and cadmium ions did not affect the ability of the arsenic ion sensor to capture the trivalent arsenic ion.

Example 5

Sodium arsenite was dissolved in two phosphate buffer solutions having different conductivities (0.02×PBS and 0.1×PBS) to detect the trivalent arsenic ion. The results are shown in FIG. 7D.

The results from FIG. 7D show that the current values of the trivalent arsenic ion having various concentrations detected in buffer solutions having different conductivities (0.02×PBS and 0.1×PBS) were very close. This means that the arsenic ion sensor was not affected by the conductivity of the buffer solution, and the slope of the calibration curve and the detection limit thereof were very close.

The above results show that the ion selective membrane ISM used was highly selective to the $As^{3+}$ ion, and was not interfered by lead ions, cadmium ions, and pentavalent arsenic ions ($As^{5+}$). Moreover, the sensitivity and dynamic range thereof were not affected by interfering ions. In addition, the results show that the sensor may detect the target metal ion in various test solutions, such as tap water, drinking water, and natural water resources.

What is claimed is:

1. A sensing cell, comprising:
   a first electrode located on a substrate and coupled to a gate of a transistor;
   a second electrode spaced apart from the first electrode and located on the substrate;
   a protective layer covering sidewalls of the first electrode and the second electrode and having a first opening and a second opening respectively exposing a first top surface of a first part of the first electrode and a second top surface of a second part of the second electrode;
   a first well located on the protective layer and surrounding the first electrode and the second electrode and having a third opening exposing the first top surface of the first part of the first electrode, the second top surface of the second part of the second electrode, and a top surface of the protective layer between the first opening and the second opening;
   a second well located on the protective layer and surrounding the first well and having a fourth opening exposing the first well, the first top surface of the first part of the first electrode, the second top surface of the second part of the second electrode, and the top surface of the protective layer between the first opening and the second opening to limit a flow range of a liquid to be tested; and
   an ion selective membrane located in the third opening and covering the first top surface of the first part of the first electrode, the second top surface of the second part of the second electrode, and the top surface of the protective layer between the first opening and the second opening.

2. The sensing cell of claim 1, wherein the ion selective membrane comprises:
   a main base film at 20 wt % to 35 wt %;
   a plasticizer at 55 wt % to 70 wt %;
   an ionophore at 1 wt % to 5 wt %; and
   an ion exchanger at 0 wt % to 10 wt %.

3. The sensing cell of claim 2, wherein the ionophore comprises a compound that may be complexed with a target metal ion to be tested.

4. The sensing cell of claim 2, wherein the ionophore comprises an arsenite ionophore I.

5. The sensing cell of claim 2, wherein the ion exchanger comprises a borate containing four benzene rings.

6. The sensing cell of claim 1, wherein a height of the second well is greater than a height of the first well.

7. The sensing cell of claim 1, wherein the second well is used to limit a height of a liquid to be tested applied in the fourth opening.

8. A sensing device, comprising:
   a plurality of sensing cells located on a substrate, wherein each of the sensing cells comprises:
   a first electrode coupled to a gate of a transistor;
   a second electrode separated from the first electrode and located on the substrate;
   a protective layer covering sidewalls of the first electrode and the second electrode and having a first opening and a second opening respectively exposing a first top surface of a first part of the first electrode and a second top surface of a second part of the second electrode;
   a first well located on the protective layer and surrounding the first electrode and the second electrode and having a third opening exposing the first top surface of the first part of the first electrode, the second top surface of the second part of the second electrode, and the protective layer between the first opening and the second opening; and
   a second well located on the protective layer and surrounding the first well and having a fourth opening exposing the first well, the first top surface of the first part of the first electrode, the second top surface of the second part of the second electrode, and the protective layer between the first opening and the second opening; and
   an ion selective membrane located in the third opening and covering the first top surface of the first part of the first electrode, the second top surface of the second part of the second electrode, and the protective layer between the first opening and the second opening.

9. The sensing device of claim 8, wherein the plurality of sensing cells are arranged in an array.

10. The sensing device of claim 9, further comprising:
    a plurality of first conductive lines, wherein each of the first conductive lines connects a plurality of first electrodes in a same column to the transistor; and
    a plurality of second conductive lines, wherein each of the second conductive lines is connected to a plurality of second electrodes in a same row.

11. The sensing device of claim 9, wherein the ion selective membrane comprises:
    a main base film at 20 wt % to 35 wt %;
    a plasticizer at 55 wt % to 70 wt %;
    an ionophore at 1 wt % to 5 wt %; and
    an ion exchanger at 0 wt % to 10 wt %.

12. The sensing device of claim 11, wherein the ionophore comprises a compound that may be complexed with a target metal ion to be tested.

13. The sensing device of claim 11, wherein the ionophore comprises arsenite ionophore I.

14. The sensing device of claim 11, wherein the ion exchanger comprises a borate containing four benzene rings.

15. The sensing device of claim 8, wherein a height of the second well is greater than a height of the first well.

16. The sensing device of claim 8, wherein the second well is used to limit a height of a liquid to be tested applied in the fourth opening.

\* \* \* \* \*